(12) United States Patent
Endo et al.

(10) Patent No.: US 9,068,100 B2
(45) Date of Patent: Jun. 30, 2015

(54) THERMOSETTING RESIN COMPOSITION, CURED PRODUCT THEREOF, AND PRINTED WIRING BOARD USING THE SAME

(71) Applicant: Taiyo Ink Mfg. Co., Ltd., Hiki-gun (JP)

(72) Inventors: Arata Endo, Tsurugashima (JP); Nobuhito Ito, Sakado (JP); Masao Arima, Kawagoe (JP)

(73) Assignee: TAIYO INK MFG. CO., LTD., Hiki-gun (JP)

( * ) Notice: Subject to any disclaimer, the term of this patent is extended or adjusted under 35 U.S.C. 154(b) by 121 days.

(21) Appl. No.: 13/661,416

(22) Filed: Oct. 26, 2012

(65) Prior Publication Data

US 2013/0109785 A1 May 2, 2013

(30) Foreign Application Priority Data

Oct. 31, 2011 (JP) .................. 2011-239566

(51) Int. Cl.
| | |
|---|---|
| *C08K 3/22* | (2006.01) |
| *C08K 7/18* | (2006.01) |
| *C08L 33/14* | (2006.01) |
| *C08L 63/00* | (2006.01) |
| *C08L 63/02* | (2006.01) |
| *H05K 7/02* | (2006.01) |
| *C09D 153/00* | (2006.01) |
| *C08K 3/36* | (2006.01) |
| *C08L 63/04* | (2006.01) |
| *C09D 163/00* | (2006.01) |
| *C09D 163/04* | (2006.01) |
| *C08L 53/00* | (2006.01) |
| *H05K 3/28* | (2006.01) |

(52) U.S. Cl.
CPC ...... *C09D 153/00* (2013.01); *C08K 2003/2227* (2013.01); *C08K 3/36* (2013.01); *C08L 33/14* (2013.01); *C08L 63/00* (2013.01); *C08L 63/04* (2013.01); *H05K 7/02* (2013.01); *C09D 163/00* (2013.01); *C09D 163/04* (2013.01); *C08K 7/18* (2013.01); *C08L 53/00* (2013.01); *H05K 3/287* (2013.01); *H05K 2201/0209* (2013.01)

(58) Field of Classification Search
None
See application file for complete search history.

(56) References Cited

U.S. PATENT DOCUMENTS

| | | | | |
|---|---|---|---|---|
| 4,859,722 | A * | 8/1989 | Shiobara et al. | 523/433 |
| 8,697,811 | B2 | 4/2014 | Kishi et al. | |
| 2006/0214153 | A1 * | 9/2006 | Ikezawa et al. | 257/40 |
| 2009/0326100 | A1 * | 12/2009 | Hamada et al. | 523/435 |

FOREIGN PATENT DOCUMENTS

| | | | |
|---|---|---|---|
| JP | 4-202518 A | * | 7/1992 |
| JP | 5-75032 | | 10/1993 |
| JP | 2006-117922 | | 5/2006 |
| JP | 2007-154160 | | 6/2007 |
| JP | 2007-154160 A | * | 6/2007 |
| JP | 2011-068788 A | | 4/2011 |
| KR | 10-2010-0131442 A | | 12/2010 |

OTHER PUBLICATIONS

Office Action issued Feb. 27, 2014 in Korean Patent Application No. 10-2012-0121059 (with partial English language translation).

* cited by examiner

*Primary Examiner* — Robert Sellers
(74) *Attorney, Agent, or Firm* — Oblon, McClelland, Maier & Neustadt, L.L.P.

(57) ABSTRACT

Provided are: a thermosetting resin composition in which a cured product is excellent in low warp properties, thermal cycle characteristics, and the like, and occurrence of cracking of a coating film in a B-stage state is suppressed; a cured product thereof; and a printed wiring board in which the cured product is used. The thermosetting resin composition comprises: (A) an epoxy resin; (B) a curing agent for an epoxy resin; (C) spherical silicon dioxide and/or spherical aluminum oxide; and (D) a block copolymer.

17 Claims, 1 Drawing Sheet

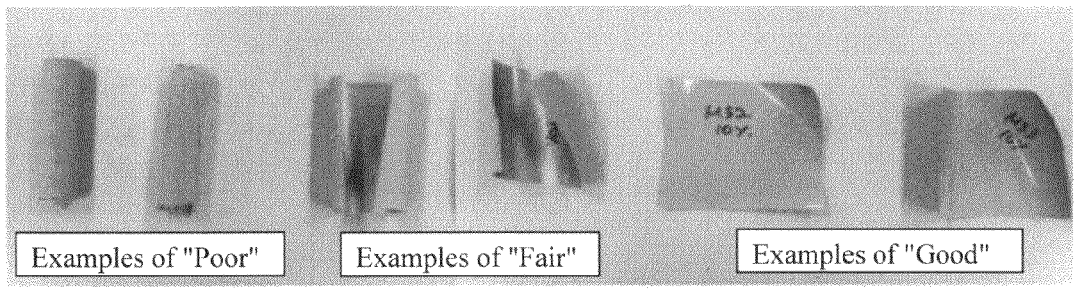

THERMOSETTING RESIN COMPOSITION, CURED PRODUCT THEREOF, AND PRINTED WIRING BOARD USING THE SAME

FIELD OF THE INVENTION

The present invention relates to a thermosetting resin composition, a cured product thereof, and a printed wiring board in which the cured product is used. Specifically, the present invention relates to a thermosetting resin composition which is capable of obtaining a cured product excellent in low warp properties and thermal cycle characteristics and causes suppressed occurrence of cracking of a coating film in a B-stage state; a cured product thereof; and a printed wiring board in which the cured product is used.

BACKGROUND ART

Solder resists have been conventionally used for manufacturing flexible printed wiring boards and tape carrier packages, including: a type in which a polyimide film referred to as a cover lay film is stamped with a die in accordance with a pattern and then pasted using an adhesive; an ultraviolet ray-curable type in which a film having flexibility is formed; a type in which a thermosetting solder resist ink is applied by screen printing; a type of the a liquid photosolder resist ink for forming a film having flexibility; and the like.

Among those in the foregoing, the cover lay film is incapable of forming a high-precision pattern because of having poor followability to copper foil. On the other hand, the ultraviolet ray-curable solder resist ink and the liquid photosolder resist ink have been still susceptible to improvement in terms of adhesiveness with the polyimide of a substrate and flexibility. Since shrinkage on curing of the solder resist ink and cooling shrinkage after curing are great, such a defect that warpage occurs may also be caused.

In contrast to such an ultraviolet ray-curable solder resist as described above, a solder resist comprising a thermosetting resin composition is generally known to be excellent in adhesiveness with a polyimide substrate and flexibility. Such solder resists comprising thermosetting resin compositions include, e.g., those described in Japanese Patent Publication No. 5-75032 (Claims) and Japanese Patent Laid-Open No. 2006-117922 (Claims).

On the other hand, printed wiring boards and flexible printed wiring boards, which are implemented in various instruments, are used. Therefore, it is demanded that they should also have resistance to sudden environmental changes including those in temperature. Accordingly, a solder resist also requires high resistance to temperature changes; however, when a difference between the coefficients of liner thermal expansion (CTE) of a thermosetting resin and a substrate or a substrate-forming material such as copper or an underfill is great, there is a problem that cracks are generated in the resist in TCT (thermal cycle test).

In contrast, in recent years, the CTE of a thermosetting resin has been widely matched with the CTE of a neighboring member material. For example, CTE can be decreased by highly filling a thermosetting resin with an inorganic filler.

RELATED ART DOCUMENTS

Patent Documents

Patent Document 1: Japanese Examined Patent Application Publication No. 5-75032 (Claims)

Patent Document 2: Japanese Unexamined Patent Application Publication No. 2006-117922 (Claims)

SUMMARY OF THE INVENTION

Problems to be Solved by the Invention

However, there has been a problem that cracking occurs in a dry film in the B stage state (semi-cured state) of a thermosetting resin composition when an inorganic filler is highly filled. Also, there has been a problem that a substrate is greatly warped after a thermosetting resin composition is sufficiently cured. Furthermore, thermal cycle characteristics have not also reached sufficiently satisfactory levels in the related art but have been susceptible to improvement.

An object of the present invention is to provide: a thermosetting resin composition in which a cured product is excellent in low warp properties, thermal cycle characteristics, and the like, and occurrence of cracking of a coating film in a B-stage state is suppressed; a cured product thereof; and a printed wiring board in which the cured product is used.

As a result of extensive examination for solving the above-described problem, the present inventors found that the above-described problem can be solved by making a thermosetting resin composition comprising an epoxy resin, a curing agent, a specific filler, and a block copolymer, and the present invention was thus accomplished.

Specifically, a thermosetting resin composition according to an embodiment of the present invention comprises: (A) an epoxy resin; (B) a curing agent for an epoxy resin; (C) spherical silicon dioxide and/or spherical aluminum oxide; and (D) a block copolymer.

In the thermosetting resin composition according to an embodiment of the present invention, the block copolymer (D) preferably has a weight average molecular weight (Mw) of 50000 or more and 300000 or less and a molecular weight distribution (Mw/Mn) of 3 or less.

In the thermosetting resin composition according to an embodiment of the present invention, the block copolymer (D) is preferably a block copolymer represented by the formula (I):

$$X—Y—X \quad\quad (I)$$

(wherein X is a polymer unit having a glass transition point Tg of 0° C. or more; and Y is a polymer unit having a glass transition point Tg of less than 0° C.).

In the thermosetting resin composition according to an embodiment of the present invention, preferably, Y comprises poly-n-butyl(meth)acrylate; and X comprises polymethyl (meth)acrylate.

In the thermosetting resin composition according to an embodiment of the present invention, the spherical silicon dioxide and/or spherical aluminum oxide (C) preferably have an amount of 50 wt % or more based on a total thermosetting resin composition.

In the thermosetting resin composition according to an embodiment of the present invention, the curing agent for an epoxy resin (B) is preferably a phenolic resin.

A thermosetting film according to an embodiment of the present invention is obtained by applying and drying, onto a film, the thermosetting resin composition according to any embodiment as described above.

A cured product according to an embodiment of the present invention prepared by heating and curing the thermosetting resin composition according to any embodiment as described above or the thermosetting film.

A printed wiring board according to an embodiment of the present invention comprises the above-described cured product.

Effects of the Invention

The present invention enables the provision of: the thermosetting resin composition in which a cured product is excellent in low warp properties and thermal cycle characteristics, and occurrence of cracking of a coating film in a B-stage state is suppressed; the cured product thereof; and the printed wiring board in which the cured product is used.

BRIEF DESCRIPTION OF THE DRAWING

FIG. 1 is a photograph representing the appearance examples of substrates corresponding to all evaluations when evaluating the warps of the substrates cured in Examples.

MODE FOR CARRYING OUT THE INVENTION

The thermosetting resin composition according to an embodiment of the present invention comprises: (A) an epoxy resin; (B) a curing agent for an epoxy resin; (C) spherical silicon dioxide and/or spherical aluminum oxide; and (D) a block copolymer. As a result, the thermosetting resin composition in which a cured product is excellent in adhesiveness with a substrate, folding resistance, low warpage properties, electrical insulating properties, and the like, and occurrence of cracking of a coating film in a B-stage state is suppressed can be obtained. The B-stage state, which is an intermediate stage of heat-curing reaction of a thermosetting resin, is a stage in which the resin is softened and expanded by heating but is not completely molten or dissolved even if coming in contact with a certain liquid.

Each component will be described in detail below.

[(A) Epoxy Resin]

As the above-described epoxy resin (A), a polyfunctional epoxy resin, known in the art, having at least two epoxy groups in one molecule may be used. The epoxy resin may be liquid, solid, or semisolid.

Epoxy resins (A) include, but are not limited to, e.g., bisphenol A type epoxy resins such as jER 828, jER 834, jER 1001, and jER 1004 manufactured by Mitsubishi Chemical Corporation, EPICLON 840, EPICLON 850, EPICLON 1050, and EPICLON 2055 manufactured by DIC Corporation, Epotohto YD-011, YD-013, YD-127, and YD-128 manufactured by Tohto Kasei Co., Ltd., D.E.R. 317, D.E.R. 331, D.E.R. 661, and D.E.R. 664 manufactured by Dow Chemical Company, Araldide 6071, Araldide 6084, Araldide GY250, and Araldide GY260 from BASF Japan Ltd., Sumi-epoxy ESA-011, ESA-014, ELA-115, and ELA-128 manufactured by Sumitomo Chemical Co., Ltd., and A.E.R. 330, A.E.R. 331, A.E.R. 661, and A.E.R. 664 manufactured by Asahi Chemical Industry Co., Ltd. (each trade name); brominated epoxy resins such as jERYL903 manufactured by Mitsubishi Chemical Corporation, EPICLON 152 and EPICLON 165 manufactured by DIC Corporation, Epotohto YDB-400 and YDB-500 manufactured by Tohto Kasei Co., Ltd., D.E.R. 542 manufactured by Dow Chemical Company, Araldide 8011 manufactured by BASF Japan Ltd., Sumi-epoxy ESB-400 and ESB-700 manufactured by Sumitomo Chemical Co., Ltd., and A.E.R. 711 and A.E.R. 714 manufactured by Asahi Chemical Industry Co., Ltd. (each trade name); novolac type epoxy resins such as jER 152 and jER 154 manufactured by Mitsubishi Chemical Corporation, D.E.N. 431 and D.E.N. 438 manufactured by Dow Chemical Company, EPICLON N-730, EPICLON N-770, and EPICLON N-865 manufactured by DIC Corporation, Epotohto YDCN-701 and YDCN-704 manufactured by Tohto Kasei Co., Ltd., Araldide ECN1235, Araldide ECN1273, Araldide ECN1299, and Araldide XPY307 manufactured by BASF Japan Ltd., EPPN-201, EOCN-1025, EOCN-1020, EOCN-104S, RE-306, and NC-3000 manufactured by Nippon Kayaku Co., Ltd., Sumi-epoxy ESCN-195X and ESCN-220 manufactured by Sumitomo Chemical Co., Ltd., A.E.R.ECN-235 and ECN-299 manufactured by Asahi Chemical Industry Co., Ltd., YDCN-700-2, YDCN-700-3, YDCN-700-5, YDCN-700-7, YDCN-700-10, YDCN-704, and YDCN-704A manufactured by Nippon Steel Chemical Co., Ltd., and EPICLON N-680, N-690, and N-695 manufactured by DIC Corporation (each trade name); bisphenol F type epoxy resins such as EPICLON 830 manufactured by DIC Corporation, jER 807 manufactured by Mitsubishi Chemical Corporation, Epotohto YDF-170, YDF-175, and YDF-2004 manufactured by Tohto Kasei Co., Ltd., and Araldide XPY306 manufactured by BASF Japan Ltd. (each trade name); hydrogenated bisphenol A type epoxy resins such as Epotohto ST-2004, ST-2007, and ST-3000 (trade names) manufactured by Tohto Kasei Co., Ltd.; glycidyl amine type epoxy resins such as jER 604 manufactured by Mitsubishi Chemical Corporation, Epotohto YH-434 manufactured by Tohto Kasei Co., Ltd., Araldide MY720 manufactured by BASF Japan Ltd., and Sumi-epoxy ELM-120 manufactured by Sumitomo Chemical Co., Ltd. (each trade name); hydantoin type epoxy resins such as Araldide CY-350 (trade name) manufactured by BASF Japan Ltd.; alicyclic epoxy resins such as Celloxide 2021 manufactured by Daicel Chemical Industries, Ltd. and Araldide CY175 and CY179 manufactured by BASF Japan Ltd. (each trade name); trihydroxyphenylmethane type epoxy resins such as YL-933 manufactured by Mitsubishi Chemical Corporation and T.E.N., EPPN-501, and EPPN-502 manufactured by Dow Chemical Company (each trade name); bixylenol or biphenol type epoxy resins such as YL-6056, YX-4000, and YL-6121 (each trade name) manufactured by Mitsubishi Chemical Corporation, or mixtures thereof; bisphenol S type epoxy resins such as EBPS-200 manufactured by Nippon Kayaku Co., Ltd., EPX-30 manufactured by ADEKA Corporation, and EXA-1514 (trade name) manufactured by DIC Corporation; bisphenol A novolac type epoxy resins such as jER 1575 (trade name) manufactured by Mitsubishi Chemical Corporation; tetraphenylol ethane type epoxy resins such as jERYL-931 manufactured by Mitsubishi Chemical Corporation and Araldide 163 manufactured by BASF Japan Ltd. (each trade name); heterocyclic epoxy resins such as Araldide PT810 manufactured by BASF Japan Ltd. and TEPIC manufactured by Nissan Chemical Industries, Ltd. (each trade name); diglycidyl phthalate resins such as Blemmer DGT manufactured by Nippon Oil & Fats Co., Ltd.; tetraglycidyl xylenoyl ethane resins such as ZX-1063 manufactured by Tohto Kasei Co., Ltd.; naphthalene group-containing epoxy resins such as ESN-190 and ESN-360 manufactured by Nippon Steel Chemical Co., Ltd., and HP-4032, EXA-4750, and EXA-4700 manufactured by DIC Corporation; dicyclopentadiene skeleton-containing epoxy resins such as HP-7200 and HP-7200H manufactured by DIC Corporation; glycidyl methacrylate copolymer-based epoxy resins such as CP-50S and CP-50M manufactured by Nippon Oil & Fats Co., Ltd.; in addition, cyclohexyl maleimide/glycidyl methacrylate copolymer epoxy resins; and CTBN modified epoxy resins (such as YR-102 and YR-450 manufactured by Tohto Kasei Co., Ltd.). Among them, bisphenol A type epoxy resins, naphthalene type epoxy resins, phenol novolac type epoxy resins, or mixtures thereof are preferred.

One of these epoxy resins may be used alone or two or more thereof may be used in combination.

The content of the epoxy resin (A) in the thermosetting resin composition is preferably 20 to 80 mass %, more preferably 20 to 60 mass %, based on the total solid of the thermosetting resin composition.

[(B) Curing Agent for Epoxy Resin]

As the curing agent for an epoxy resin (B), which is a compound having a group reacting with an epoxy group, any known curing agent for an epoxy resin may be used. Such curing agents for an epoxy resin include polyfunctional phenolic compounds, polycarboxylic acids and acid anhydrides thereof, cyanate ester resins, active ester resins, aliphatic or aromatic, primary or secondary amines, polyamide resins, polymercapto compounds, and the like. Among them, polyfunctional phenolic compounds, polycarboxylic acids and acid anhydrides thereof, cyanate ester resins, and active ester resins are preferred, and polyfunctional phenolic compounds are more preferred.

As the above-described polyfunctional phenolic compound, which is preferably a polyfunctional phenolic compound having two or more phenolic hydroxyl groups in one molecule, a polyfunctional phenolic compound known in the art may be used. Specifically, such polyfunctional phenolic compounds include phenol novolac resins, cresol novolac resins, bisphenol A, allylated bisphenol A, bisphenol F, bisphenol A novolac resins, vinylphenol copolymer resins, and the like. Also, the polyfunctional phenolic compound may be a triazine ring-containing novolac resin which is a polycondensation product of each phenol, an aldehyde, and a compound having a triazine ring. Among the phenolic compounds, phenolic resins are preferred, and phenol novolac resins are more preferred because of having high reactivity and a high effect of increasing heat resistance. Commercially available polyfunctional phenolic compounds used as the curing agents for an epoxy resin include, e.g., cresol novolac resins such as GPX-41 manufactured by Gifu Shellac Manufacturing Co., Ltd.; trisphenol methane type phenolic resins such as MEH-7500H manufactured by Meiwa Plastic Industries, Ltd.; biphenyl-aralkyl type phenolic resins such as MEH-7851-4H manufactured by Meiwa Plastic Industries, Ltd.; phenol novolac resins such as HF-1M H60 manufactured by Meiwa Plastic Industries, Ltd.; and the like.

The above-described polycarboxylic acids and acid anhydrides thereof are compounds having two or more carboxyl groups in one molecule and acid anhydrides thereof and include, e.g., (meth)acrylic acid copolymers, maleic anhydride copolymers, dibasic acid condensation products, and the like as well as resins having carboxylic acid terminals such as carboxylic acid-terminated imide resins. Commercially available products include Joncryl (product group name) manufactured by BASF AG; SMA Resins (product group names) manufactured by Sartomer Company; polyazelaic polyanhydride manufactured by New Japan Chemical Co., Ltd.; carboxylic acid-terminated polyimide resins such as V-8000 and V-8002 manufactured by DIC Corporation; and the like.

The above-described cyanate ester resins are compounds having two or more cyanate ester groups (—OCN) in one molecule. Any known cyanate ester resins may be used. The cyanate ester resins include, e.g., phenol novolac type cyanate ester resins, alkylphenol novolac type cyanate ester resins, dicyclopentadiene type cyanate ester resins, bisphenol A type cyanate ester resins, bisphenol F type cyanate ester resins, and bisphenol S type cyanate ester resins. Such a cyanate ester resin may also be a prepolymer having a portion made to be a triazine. Commercially available products of the cyanate ester resins include a phenol novolac type polyfunctional cyanate ester resin, PT30, manufactured by Lonza Japan, Ltd.; a bisphenol A type dicyanate prepolymer having a portion made to be a triazine, BA230, manufactured by Lonza Japan, Ltd.; dicyclopentadiene structure-containing cyanate ester resins, DT-4000 and DT-7000, manufactured by Lonza Japan, Ltd.; and the like.

The above-described active ester resins are resins having two or more active ester groups in one molecule. Generally, an active ester resin can be obtained by condensation reaction of a carboxylic compound with a hydroxy compound. Especially, an active ester compound obtained using a phenolic compound or a naphthol compound is preferred as the hydroxy compound. Such phenolic or naphthol compounds include hydroquinone, resorcin, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyldiphenol, phenol-novolac, and the like. Commercially available active ester compounds include, e.g., EXB-9451 and EXB-9460 manufactured by DIC Corporation; DC808 and YLH1030 manufactured by Mitsubishi Chemical Corporation; and the like.

In the mixing rate of the curing agent for an epoxy resin, the group reacting with the epoxy group in the curing agent for an epoxy resin is preferably 0.3 to 1.5 mol, more preferably 0.4 to 1.3 mol, based on 1 mol of the above-described epoxy resin. When the ratio is outside this range of the molar ratio, there is apprehension that laminate and insulation properties are deteriorated.

[(C) Spherical Silicon Dioxide and/or Spherical Aluminum Oxide]

The components (C) are spherical silicon dioxide (also referred to as spherical silica), spherical aluminum oxide (also referred to as spherical alumina), or spherical silicon dioxide and spherical aluminum oxide.

Any spherical silicon dioxide is preferable if being spherical silicon dioxide usable as a filler for use in an electronic material. The average particle diameter (D50) thereof is preferably 0.1 to 10 μm. The average particle diameter is measured by laser diffractometry. The spherical silicon dioxide of which the surface is treated with a silane coupling agent is also preferred.

The components (C) are preferably spherical without limitation to those that are true-spherical. The components (C) which are preferred include, but are not limited to, e.g., those having a sphericity of 0.8 or more, measured as described below.

The sphericity is measured as described below. It is calculated as a value calculated by (sphericity)=$[4\pi \times (area)/(boundary\ length)2]$, from the area and boundary length of an observed particle from a photograph with SEM. Specifically, an average value measured for 100 particles using an image processing device is adopted.

For a method for producing spherical silica particles and spherical alumina, which method is not particularly limited, methods known to those skilled in the art may be applied. For example, a silicon powder or an aluminum powder can be burnt to produce spherical silica particles or spherical alumina by a VMC (Vaporized Metal Combustion) method. The VMC method is a method of: forming a chemical flame in an atmosphere containing oxygen by a burner; charging into the chemical flame such an amount of a metallic powder which constitutes a part of oxide particles of interest that a dust cloud is formed; and causing deflagration to obtain the oxide particles.

As commercially available spherical silica, mention is made of SO series manufactured by Admatechs Company Limited; HPS series (such as HPS-0500, HPS-1000, and HPS3500) manufactured by Toagosei Co., Ltd.; and the like.

As the above-described spherical alumina, any spherical alumina may be used if being usable as a filler for use in an electronic material. It preferably has an average particle diameter (D50) of 0.1 to 20 μm, more preferably 0.1 to 10 μm. In addition, it preferably has a sphericity of 0.8 or more.

As commercially available spherical alumina, mention is made of AO series manufactured by Admatechs Company Limited; TC-975c manufactured by Admatechs Company Limited; ALUNABEADS/CB series manufactured by Showa Denko K.K.; and the like.

The spherical silica and the spherical alumina can be expected to have an advantage such as improvement in folding resistance because of having good dispersibility in a resin and having no surface to be the origin of cracking a cured coating. Also, they are excellent in thermal cycle characteristics. Further, the spherical alumina is also excellent in heat dissipation characteristics.

One kind of the spherical silica and the spherical alumina may be used alone or two kinds or more thereof may be used in combination. The amount of the mixed component (C) is preferably 50 mass % or more, more preferably 50 to 90 mass %, based on the total thermosetting resin composition. The mixture of the large amount thereof exceeding the above-described range or the excessively small amount thereof is unfavorable because of the occurrence of a problem that the mixture of the large amount thereof exceeding the above-described range causes insufficient embedment in a substrate or a circuit during lamination as a dry film on the substrate while the excessively small amount thereof deteriorates thermal cycle characteristics.

[(D) Block Copolymer]

The block copolymer (D) refers to a copolymer having a molecular structure in which two or more qualitatively different polymers are linked by covalent bonds to make a long chain. It is preferably a solid in the range of 20° C. to 30° C. It is preferably a solid in this range and may also be solid even at a temperature outside the range. Since it is a solid in the above-described temperature range, it is excellent in tacking properties when it is made into a dry film, or applied to a substrate and pre-dried.

For the block copolymer used in accordance with an embodiment of the present invention, X—Y—X or X—Y—X' type block copolymers are preferred. Among the X—Y—X or X—Y—X' type block copolymers, preferred are those constituted by polymer units in which central Y is a soft block and has a low glass transition point Tg of preferably less than 0° C. and each outside X or X' is a hard block and has high Tg of preferably 0° C. or more. The glass transition point Tg is measured by differential scanning calorimetry (DSC).

In addition, among the X—Y—X or X—Y—X' type block copolymers, further preferred are block copolymers in which X or X' comprises a polymer unit having Tg of 50° C. or more and Y comprises a polymer unit having Tg of −20° C. or less.

In addition, among the X—Y—X or X—Y—X' type block copolymers, preferred are those in which X or X' has high compatibility with the above-described epoxy resin (A), and preferred are those in which Y has low compatibility with the above-described epoxy resin (A). Thus, it is considered that a specific structure is easily exhibited in a matrix by a block copolymer in which blocks at both ends are compatible with the matrix and a central block is not compatible with the matrix.

Polymethyl (meth)acrylate (PMMA), polystyrene (PS), or the like is preferably contained as X or X', and poly-n-butyl acrylate (PBA), polybutadiene (PB), poly-n-butylmethacrylate, or the like is preferably contained as Y. In addition, a hydrophilic unit excellent in compatibility with the above-described epoxy resin, represented by a styrene unit, a hydroxyl group-containing unit, a carboxyl group-containing unit, an epoxy-containing unit, an N-substituted acrylamide unit, or the like, can be introduced into a part of the X or X' component to further improve the compatibility. In the present invention, (meth)acrylate may be any of acrylate, methacrylate, and those mixtures.

Commercially available products of the block copolymers include an acrylic triblock copolymer produced using living polymerization, manufactured by Arkema K.K. Mention is made of SBM types represented by polystyrene-polybutadiene-polymethyl methacrylate; MAM types represented by polymethyl methacrylate-polybutylacrylate-polymethyl methacrylate; and, in addition, MAM N types and MAM A types subjected to carboxylic acid modification or hydrophilic group modification treatment. The SBM types include E41, E40, E21, E20, and the like; the MAM types include M51, M52, M53, M22, and the like; the MAM N types include 52N and 22N; and the MAMA types include SM4032XM10 and the like. Also, KURARITY manufactured by Kuraray Co., Ltd. is a block copolymer derived from methyl methacrylate and butyl acrylate.

The block copolymers used in accordance with an embodiment of the present invention are preferably ternary or higher block copolymers, more preferably block copolymers that are synthesized by a living polymerization method and have precisely controlled molecular structures, for obtaining advantages offered by the present invention. This is considered to be because the block copolymers synthesized by the living polymerization method have narrow molecular weight distributions and the definite feature of each unit. The molecular weight distribution (Mw/Mn) of a block copolymer used is preferably 3 or less, more preferably 2.5 or less, further preferably 2.0 or less.

Such a block copolymer containing a (meth)acrylate polymer block as described above can be preferably obtained by, for example, a method described in Japanese Patent Laid-Open No. 2007-516326 or 2005-515281, especially, by polymerizing a Y unit with, as an initiator, an alkoxyamine compound represented by any of the following formulae (1) to (4):

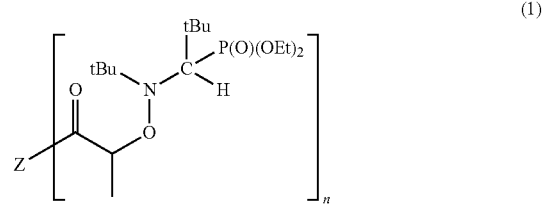

(1)

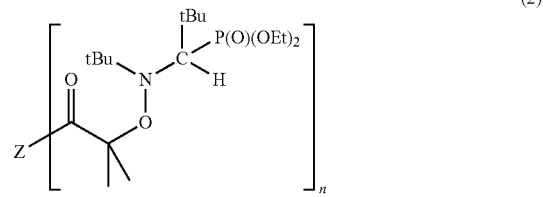

(2)

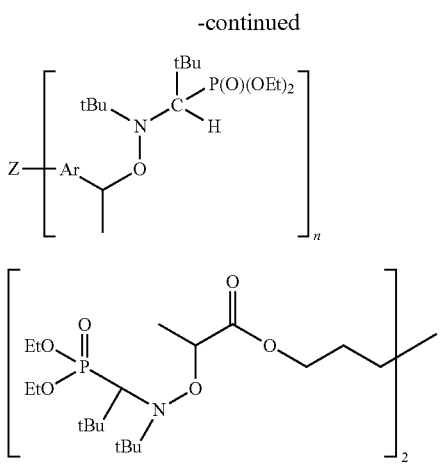

(wherein n represents 2; Z represents a divalent organic group and is preferably selected from 1,2-ethanedioxy, 1,3-propanedioxy, 1,4-butanedioxy, 1,6-hexanedioxy, 1,3,5-tris(2-ethoxy)cyanuric acid, polyaminoamines such as polyethyleneamines, 1,3,5-tris(2-ethylamino)cyanuric acid, polythioxy, phosphonate, or polyphosphonate; and Ar represents a divalent aryl group), followed by polymerizing an X unit.

The weight average molecular weight of the block copolymer preferably ranges from 20,000 to 400,000, more preferably from 50,000 to 300,000. In the case of the weight average molecular weight of less than 20,000, advantages of toughness and flexibility of interest are not obtained, and tacking properties are poor when the thermosetting resin composition is made into a dry film, or applied to a substrate and pre-dried. In contrast, in the case of the weight average molecular weight of more than 400,000, the viscosity of the thermosetting resin composition may be increased to significantly deteriorate printability and workability. When the weight average molecular weight is 50000 or more, an excellent advantage in relaxation of shock from the outside is obtained.

The amount of the above-described mixed block copolymer is preferably ranges from 1 to 50 parts by mass, more preferably from 5 to 35 parts by mass, in terms of a solid content, based on 100 parts by mass of the epoxy resin (A). The amount of less than 1 part by mass or more than 50 parts by mass is unfavorable because the advantages cannot be expected in the case of less than 1 part by mass and there is apprehension that workability and the desmear resistance of an obtained cured product are deteriorated in the case of more than 50 parts by mass.

(Thermosetting Component)

The thermosetting resin composition according to an embodiment of the present invention may also further comprise another thermosetting component for the purpose of improving characteristics such as heat resistance and insulation reliability. As the thermosetting component, a thermosetting resin known in the art such as an amino resin, an isocyanate compound, a blocked isocyanate compound, a maleimide compound, a benzoxazine compound, an oxazoline compound, a carbodiimide compound, a cyclocarbonate compound, a polyfunctional oxetane compound, or an episulfide resin may be used.

Such amino resins as described above include amino resins such as melamine derivatives and benzoguanamine derivatives. Examples are methylol melamine compounds, methylol benzoguanamine compounds, methylol glycoluril compounds, and methylolurea compounds. Further, an alkoxymethylated melamine compound, an alkoxymethylated benzoguanamine compound, an alkoxymethylated glycoluril compound, and an alkoxymethylated urea compound are obtained by converting the respective methylol groups of a methylol melamine compound, a methylol benzoguanamine compound, a methylol glycoluril compound, and a methylolurea compound into alkoxymethyl groups. The kinds of the alkoxymethyl groups may be, without limitation, e.g., a methoxymethyl group, an ethoxymethyl group, a propoxymethyl group, a butoxymethyl group, and the like. Especially, a melamine derivative having a formalin concentration of 0.2% or less good for the human body and the environment is preferred.

Commercially available products of the above-described amino resins may include, e.g., Cymel 300, 301, 303, 370, 325, 327, 701, 266, 267, 238, 1141, 272, 202, 1156, 1158, 1123, 1170, 1174, UFR65, and 300 (all manufactured by Mitsui Cyanamid Ltd.); NIKALAC Mx-750, Mx-032, Mx-270, Mx-280, Mx-290, Mx-706, Mx-708, Mx-40, Mx-31, Ms-11, Mw-30, Mw-30HM Mw-390, Mw-100LM, and Mw-750LM (all manufactured by Sanwa Chemical Co., Ltd.); and the like.

As the above-described isocyanate compound, a polyisocyanate compound having a plurality of isocyanate groups in a molecule may be used. As the polyisocyanate compound, for example, an aromatic polyisocyanate, an aliphatic polyisocyanate, or an alicyclic polyisocyanate is used. Specific examples of the aromatic polyisocyanate include 4,4'-diphenylmethanediisocyanate, 2,4-tolylenediisocyanate, 2,6-tolylenediisocyanate, naphthalene-1,5-diisocyanate, o-xylylenediisocyanate, m-xylylenediisocyanate, and 2,4-tolylene dimers. Specific examples of the aliphatic polyisocyanate include tetramethylene diisocyanate, hexamethylene diisocyanate, methylene diisocyanate, trimethylhexamethylene diisocyanate, 4,4-methylenebis(cyclohexylisocyanate), and isophorone diisocyanate. Specific examples of the alicyclic polyisocyanate include bicycloheptane triisocyanate. In addition, adduct, biuret, and isocyanurate products of the above-mentioned isocyanate compounds are included.

The blocked isocyanate group contained in the blocked isocyanate compound is a temporarily inactivated group which is obtained by protecting an isocyanate group via a reaction with a blocking agent. When the blocked isocyanate group is heated to a pre-determined temperature, the blocking agent is dissociated to yield an isocyanate group.

As the blocked isocyanate compound, an addition reaction product between an isocyanate compound and an isocyanate blocking agent is used. Such isocyanate compounds which can react with a blocking agent include isocyanurate type, biuret type, and adduct type compounds, and the like. Isocyanate compounds used for synthesizing the blocked isocyanate compounds include, e.g., aromatic polyisocyanates, aliphatic polyisocyanates, or alicyclic polyisocyanates. Specific examples of the aromatic, aliphatic, and alicyclic polyisocyanates include such compounds as exemplified above.

Such isocyanate blocking agents include, e.g., phenol type blocking agents such as phenol, cresol, xylenol, chlorophenol, and ethylphenol; lactam type blocking agents such as ε-caprolactam, δ-valerolactam, γ-butyrolactam, and β-propiolactam; activated methylene type blocking agents such as ethyl acetoacetate and acetylacetone; alcohol type blocking agents such as methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate, and ethyl lactate; oxime type blocking agents such as formaldehyde oxime, acetaldoxime, acetoxime, methyl ethyl ketoxime, diacetyl monooxime, and cyclohexane oxime; mercaptan type blocking agents such as butyl mercaptan, hexyl mercaptan, t-butylmercaptan, thiophenol, methylthiophenol, and ethylthiophenol; acid amide type blocking agents such as acetic acid amide and benzamide; imide type blocking agents such as succinic acid imide and maleic acid imide; amine type blocking agents such as xylidine, aniline, butylamine, and dibutylamine; imidazole type blocking agents such as imidazole and 2-ethylimidazole; imine type blocking agents such as methyleneimine and propyleneimine; and the like.

The blocked isocyanate compound may be commercially available and examples thereof include SUMIDUR BL-3175, BL-4165, BL-1100, BL-1265, DESMODUR TPLS-2957, TPLS-2062, TPLS-2078, TPLS-2117, DESMOTHERM 2170, and DESMOSOME 2265 (all manufactured by Sumitomo Bayer Urethane Co., Ltd.; trade names); CORONATE 2512, CORONATE 2513, and CORONATE 2520 (all manufactured by Nippon Polyurethane Industry Co., Ltd.; trade names); B-830, B-815, B-846, B-870, B-874, and B-882 (all manufactured by Mitsui Takeda Chemicals, Inc.; trade names); TPA-B80E, 17B-60PX, and E402-B80T (all manufactured by Asahi Kasei Chemicals Corp.; trade names); and the like. SUMIDUR BL-3175 and BL-4265 are obtained by using methylethyl oxime as a blocking agent.

The amount of the above-described mixed polyisocyanate or blocked isocyanate compound is preferably 1 to 100 parts by mass, more preferably 2 to 70 parts by mass, based on 100 parts by mass of the epoxy resin (A). The mixing amount of less than 1 part by mass is unfavorable since the sufficient toughness of a coating film may not be obtained. On the other hand, the case of more than 100 parts by mass is unfavorable since preservation stability may be deteriorated.

A urethanization catalyst can be further added to the thermosetting resin composition according to an embodiment of the present invention. As the urethanization catalyst, one or more urethanization catalysts selected from the group consisting of tin-based catalysts, metal chlorides, metal acetylacetonates, metal sulfates, amine compounds, and/or amine salts are preferably used.

The tin-based catalysts include, e.g., organotin compounds such as stannous octoate and dibutyltin dilaurate, inorganic tin compounds, and the like.

The metal chlorides are chlorides of metals selected from the group consisting of Cr, Mn, Co, Ni, Fe, Cu, and Al and include, e.g., cobaltic chloride, nickelous chloride, ferric chloride, and the like.

The metal acetylacetonates are acetylacetonates of metals selected from the group consisting of Cr, Mn, Co, Ni, Fe, Cu, and Al and include, e.g., cobalt acetylacetonates, nickel acetylacetonates, iron acetylacetonates, and the like.

The metal sulfates are sulfates of metals selected from the group consisting of Cr, Mn, Co, Ni, Fe, Cu, and Al and include, e.g., copper sulfate and the like.

The maleimide compounds include polyfunctional aliphatic/alicyclic maleimides and polyfunctional aromatic maleimides. The polyfunctional aliphatic/alicyclic maleimides are, e.g., N,N'-methylenebismaleimide, N,N'-ethylenebismaleimide, isocyanuric skeleton polymaleimides such as isocyanurate skeleton-containing maleimide ester compounds obtained by dehydration esterification of tris(hydroxyethyl)isocyanurate with aliphatic/alicyclic maleimidocarboxylic acids and isocyanurate skeleton-containing maleimide urethane compounds obtained by urethanization of tris(carbamatehexyl)isocyanurate with aliphatic/alicyclic maleimide alcohols; isophorone bisurethane bis(N-ethylmaleimide), triethyleneglycol bis(maleimidoethyl carbonate), aliphatic/alicyclic polymaleimide ester compounds obtained by dehydration esterification of aliphatic/alicyclic maleimidocarboxylic acids with various aliphatic/alicyclic polyols or transesterification of aliphatic/alicyclic maleimidocarboxylates with various aliphatic/alicyclic polyols; aliphatic/alicyclic polymaleimide ester compounds obtained by ether ring-opening reaction of aliphatic/alicyclic maleimidocarboxylic acids with various aliphatic/alicyclic polyepoxides; aliphatic/alicyclic polymaleimide urethane compounds obtained by urethanization reaction of aliphatic/alicyclic maleimide alcohols with various aliphatic/alicyclic polyisocyanates; and the like.

The polyfunctional aromatic maleimides are aromatic polyfunctional maleimides such as aromatic polymaleimide ester compounds obtained by dehydration esterification of maleimidocarboxylic acids with various aromatic polyols or transesterification of maleimidocarboxylates with various aromatic polyols, aromatic polymaleimide ester compounds obtained by ether ring-opening reaction of maleimidocarboxylic acids with various aromatic polyepoxides, and aromatic polymaleimide urethane compounds obtained by urethanization reaction of maleimide alcohols with various aromatic polyisocyanates; and the like.

Specific examples of the polyfunctional aromatic maleimides may include, e.g., N,N'-(4,4'-diphenylmethane)bismaleimide, N,N'-2,4-tolylenebismaleimide, N,N'-2,6-tolylenebismaleimide, 1-methyl-2,4-bismaleimidebenzene, N,N'-m-phenylenebismaleimide, N,N'-p-phenylenebismaleimide, N,N'-m-toluoylenebismaleimide, N,N'-4,4'-biphenylenebismaleimide, N,N'-4,4'-[3,3'-dimethyl-biphenylene]bismaleimide, N,N'-4,4'-[3,3'-dimethyldiphenylmethane]bismaleimide, N,N'-4,4'-[3,3'-diethyldiphenylmethane]bismaleimide, N,N'-4,4'-diphenylmethanebismaleimide, N,N'-4,4'-diphenylpropanebismaleimide, N,N'-4,4'-diphenyletherbismaleimide, N,N'-3,3'-diphenylsulfonebismaleimide, N,N'-4,4'-diphenylsulfonebismaleimide, 2,2-bis[4-(4-maleimidephenoxy)phenyl]propane, 2,2-bis[3-t-butyl-4-(4-maleimidephenoxy)phenyl]propane, 2,2-bis[3-s-butyl-4-(4-maleimidephenoxy)phenyl]propane, 1,1-bis[4-(4-maleimidephenoxy)phenyl]decane, 1,1-bis[2-methyl-4-(4-maleimidephenoxy)-5-t-butylphenyl]-2-methylpropane, 4,4'-cyclohexylidene-bis[1-(4-maleimidephenoxy)-2-(1,1-dimethylethyl)benzene], 4,4'-methylene-bis[1-(4-maleimidephenoxy)-2,6-bis(1,1-dimethylethyl)benzene], 4,4'-methylene-bis[1-(4-maleimidephenoxy)-2,6-di-s-butylbenzene], 4,4'-cyclohexylidene-bis[1-(4-maleimidephenoxy)-2-cyclohexylbenzene], 4,4'-methylenebis[1-(maleimidephenoxy)-2-nonylbenzene], 4,4'-(1-methylethylidene)-bis[1-(maleimidephenoxy)-2,6-bis(1,1-dimethylethyl)benzene], 4,4'-(2-ethylhexylidene)-bis[1-(maleimidephenoxy)-benzene], 4,4'-(1-methylheptylidene)-bis[1-(maleimidephenoxy)-benzene], 4,4'-cyclohexylidene-bis[1-(maleimidephenoxy)-3-methylbenzene], 2,2-bis[4-(4-maleimidephenoxy)phenyl] hexafluoropropane, 2,2-bis[3-methyl-4-(4-maleimidephenoxy)phenyl]propane, 2,2-bis[3-methyl-4-(4-maleimidephenoxy)phenyl]hexafluoropropane, 2,2-bis[3,5-dimethyl-4-(4-maleimidephenoxy)phenyl]propane, 2,2-bis[3,5-dimethyl-4-(4-maleimidephenoxy)phenyl] hexafluoropropane, 2,2-bis[3-ethyl-4-(4-maleimidephenoxy)phenyl]propane, 2,2-bis[3-ethyl-4-(4-maleimidephenoxy)phenyl]hexafluoropropane, bis[3-methyl-(4-maleimidephenoxy)phenyl]methane, bis[3,5-dimethyl-(4-maleimidephenoxy)phenyl]methane, bis[3-ethyl-(4-maleimidephenoxy)phenyl]methane, 3,8-bis[4-(4-maleimidephenoxy)phenyl]-tricyclo[5.2.1.02.6]decane, 4,8- bis[4-(4-maleimidephenoxy)phenyl]-tricyclo[5.2.1.02.6]decane, 3,9-bis[4-(4-maleimidephenoxy)phenyl]-tricyclo[5.2.1.02.6]decane, 4,9-bis[4-(4-maleimidephenoxy)phenyl]-tricyclo[5.2.1.02.6]decane, 1,8-bis[4-(4-maleimidephenoxy)phenyl]menthane, 1,8-bis[3-methyl-4-(4-maleimidephenoxy)phenyl]menthane, 1,8-bis[3,5-dimethyl-4-(4-maleimidephenoxy)phenyl]menthane, and the like.

Commercially available products of the maleimide compounds may include, e.g., BMI-1000, BMI-1000H, BMI-1000S, BMI-1100, BMI-1100H, BMI-2000, BMI-2300, BMI-3000, BMI-3000H, BMI-4000, BMI-5100, BMI-7000, BMI-7000H, and BMI-TMH (all manufactured by Daiwakasei Industry Co., Ltd.); MIA-200 (manufactured by DIC Corporation); and the like.

As these bismaleimide derivatives, which may be synthesized by a usual method, commercially available products may also be used. Especially, among the bismaleimide derivatives, those containing no halogen atom in a molecule are preferred from the viewpoint of eliminating loads to the environment. One of them may be used alone or two or more thereof may be used in combination.

Such benzoxazine compounds as described above include bisphenol A type benzoxazine, bisphenol F type benzoxazine, bisphenol S type benzoxazine, and the like. These commercially available products may include "F-a" (manufactured by Shikoku Chemicals Corporation).

Such oxazoline compounds as described above are not particularly limited if containing an oxazoline group. Commercially available products thereof include Epocros (manufactured by Nippon Shokubai Co., Ltd.) K-2010E, K-2020E, K-2030E, WS-500, WS-700, and RPS-1005.

Such carbodiimide compounds as described above include dicyclohexylcarbodiimide, diisopropylcarbodiimide, and the like.

The cyclocarbonate compound is not particularly limited if being a cyclic compound and having a carbonate bond. Examples thereof include alkylene carbonate compounds having polyfunctional structures.

Such polyfunctional oxetane compounds as described above include polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methylacrylate, (3-ethyl-3-oxetanyl)methylacrylate, (3-methyl-3-oxetanyl)methylmethacrylate, (3-ethyl-3-oxetanyl)methylmethacrylate, and oligomers and copolymers thereof; also etherified products of oxetane alcohols with novolac resins or hydroxyl group-containing resins such as poly(p-hydroxystyrene), cardo type bisphenols, calixarenes, calixresorcinarenes, and silsesquioxanes; and the like. In addition, a copolymer of an unsaturated monomer having an oxetane ring with alkyl(meth)acrylate is also included.

Such episulfide resins as described above include, e.g., YL7000 (bisphenol A type episulfide resin) manufactured by Japan Epoxy Resins Co., Ltd.; and the like. Further, an episulfide resin in which the oxygen atom in the epoxy group of a novolac type epoxy resin is replaced with a sulfur atom using the same synthetic method; and/or the like may also be used.

The thermosetting resin composition according to an embodiment of the present invention preferably contains a heat-curing catalyst. Such heat-curing catalysts include, e.g., imidazole derivatives such as imidazole, 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; amine compounds such as dicyandiamide, benzyldimethylamine, 4-(dimethylamino)-N,N-dimethylbenzylamine, 4-methoxy-N,N-dimethylbenzylamine, and 4-methyl-N,N-dimethylbenzylamine; hydrazine compounds such as adipic acid dihydrazide and sebacic acid dihydrazide; phosphorus compounds such as triphenylphosphine; and the like. Further, commercially available products thereof include, e.g., 2MZ-A, 2MZ-OK, 2PHZ, 2P4BHZ, and 2P4MHZ (all are the trade names of imidazole-based compounds) manufactured by Shikoku Chemicals Corporation; U-CAT (registered trademark) 3503N, U-CAT3502T (all are the trade names of blocked isocyanate compounds of dimethylamine), DBU, DBN, U-CATSA102, and U-CAT5002 (all are bicyclic amidine compounds and salts thereof) manufactured by San-Apro Ltd.; and the like. It is not particularly limited thereto but a heat-curing catalyst from an epoxy resin or an oxetane compound or a heat-curing catalyst which accelerates a reaction of an epoxy group and/or an oxetanyl group with a carboxyl group may be used. It may be used alone or in combination of two or more. Further, guanamine, acetoguanamine, benzoguanamine, melamine, S-triazine derivatives such as 2,4-diamino-6-methacryloyloxyethyl-5-triazine, 2-vinyl-2,4-diamino-5-triazine, 2-vinyl-4,6-diamino-5-triazine isocyanuric acid adduct, and 2,4-diamino-6-methacryloyloxy ethyl-5-triazine isocyanuric acid adduct, tetraphenylphosphoniumtetraphenylborate and tetraphenylphosphoniumtetra-p-tolylborate manufactured by Hokko Chemical Industry Co., Ltd., and the like may also be used. These compounds which also function as agents for imparting adhesiveness are preferably used in combination with such a heat-curing catalyst as described above.

The amount of the mixed heat-curing catalyst is preferably 0.1 to 20 parts by mass, more preferably 0.5 to 15.0 parts by mass, based on 100 parts by mass of the epoxy resin. Further, the amount of a metal catalyst ranges from 10 to 500 ppm, preferably from 25 to 200 ppm, in terms of a metal, based on 100 parts by mass of a cyanate ester resin.

(Colorant)

The thermosetting resin composition according to an embodiment of the present invention may be mixed with a colorant. As the colorant, a colorant, known in the art, having a red color, a blue color, a green color, a yellow color, or the like may be used. It may also be any of pigments, dyes, and coloring matters. Specific examples may include those given with the Color Index (C. I.; published by The Society of Dyers and Colourists) number. However, the colorant preferably contains no halogen from the viewpoint of environmental loading reduction and an effect on the human body.

Red Colorant:

Red colorants include monoazo-based, disazo-based, azolake-based, benzimidazolone-based, perylene-based, diketopyrrolopyrrole-based, condensed azo-based, anthraquinone-based, and quinacridone-based colorants; and the like.

Blue Colorant:

Blue colorants are phthalocyanine-based and anthraquinone-based colorants. Pigment-based colorants are compounds classified as pigments. In addition to the above-described colorants, a metal substituted or unsubstituted phthalocyanine compound may also be used.

Green Colorant:

Green colorants are similarly phthalocyanine-based, anthraquinone-based, and perylene-based colorants. In addition to the above-described colorants, a metal substituted or unsubstituted phthalocyanine compound may also be used.

Yellow Colorant:

Yellow colorants include monoazo-based, disazo-based, condensed azo-based, benzimidazolone-based, isoindolinone-based, and anthraquinone-based colorants; and the like.

In addition, a colorant having a violet color, an orange color, a brown color, a black color, or the like may also be added for the purpose of controlling a color tone.

(Filler)

The thermosetting resin composition according to an embodiment of the present invention may be mixed with a filler other than the above-described component (C) as needed. As such fillers, inorganic or organic fillers known in the art may be used, and, especially, barium sulfate, Neuburg silica particles, and talc are preferably used. Also, aluminum hydroxide, magnesium hydroxide, boehmite, or the like may be used for the purpose of imparting flame retardancy. Furthermore, a compound having one or more ethylenically unsaturated groups, NANOCRYL (trade name) XP 0396, XP 0596, XP 0733, XP 0746, XP 0765, XP 0768, XP 0953, XP 0954, and XP 1045 (all are product grade names) manufactured by Hanse-Chemie GmbH, in which nanosilica is dispersed in the polyfunctional epoxy resin, and NANOPDX (trade name) XP 0516, XP 0525, and XP 0314 (all are product grade names) manufactured by Hanse-Chemie GmbH may also be used. One of them may be used alone or two or more thereof may be used in combination.

(Binding Polymer)

In the thermosetting resin composition according to an embodiment of the present invention, a binding polymer known in the art may be used for the purpose of improving the flexibility and tacky dry properties of an obtained cured product. As the binding polymer, cellulose-based, polyester-based, phenoxy resin-based polymers, polyvinylacetal-based, polyvinylbutyral-based, polyamide-based, and polyamideimide-based polymers are preferred. The cellulose type polymers include cellulose acetate butyrate (CAB) and cellulose acetate propionate (CAP) series manufactured by Eastman Chemical Company; the polyester-based polymers include Vylon series manufactured by Toyobo Co., Ltd.; and specific examples of the phenoxy resin-based polymers include FX280 and FX293 manufactured by Tohto Kasei Co., Ltd., YX8100, YL6954, and YL6974 manufactured by Japan Epoxy Resins Co., Ltd., and the like. Specific examples of the polyvinylacetal-based polymers include S-Lec KS series manufactured by Sekisui Chemical Co., Ltd.; specific examples of the polyvinylbutyral-based polymers include S-Lec B series manufactured by Sekisui Chemical Co., Ltd.; the polyamide-based polymers include KS5000 series manufactured by Hitachi Chemical Company, Ltd. and BP series manufactured by Nippon Kayaku Co., Ltd.; and, furthermore, the polyamideimide-based polymers include KS9000 series manufactured by Hitachi Chemical Company, Ltd., and the like. One of the above-described binding polymers may be used alone or two or more thereof may be used in combination.

The amount of the above-described added binding polymer is preferably not more than 50 parts by mass, more preferably 1 to 30 parts by mass, particularly preferably 5 to 30 parts by mass, based on 100 parts by mass of the above-described epoxy resin (A). The case in which the amount of the mixed binding polymer is more than 50 parts by mass is unfavorable since there is apprehension that the desmear resistance of the thermosetting resin composition is deteriorated.

(Elastomer)

The thermosetting resin composition according to an embodiment of the present invention may be mixed with an elastomer for the purpose of imparting further flexibility and improving the brittleness of a cured product. Such elastomers include, e.g., polyester-based elastomers, polyurethane-based elastomers, polyester-urethane-based elastomers, polyamide-based elastomers, polyesteramide-based elastomers, acrylic elastomers, and olefinic elastomers. Also, resins in which some or all of the epoxy groups in epoxy resins having various skeletons are modified by butadiene-acrylonitrile rubber modified by carboxylic acid at both terminals may be used. Furthermore, epoxy-containing polybutadiene-based elastomers, acryl-containing polybutadiene-based elastomers, hydroxyl group-containing polybutadiene-based elastomers, hydroxyl group-containing isoprene-based elastomers, and the like may also be used. One of the elastomers may be used alone or two or more thereof may be used as a mixture.

(Adhesion Accelerator)

In the thermosetting resin composition according to an embodiment of the present invention, an adhesion accelerator may be used to improve adhesiveness between layers or adhesiveness between a thermosetting resin layer and a substrate. Such adhesion accelerators are, e.g., benzimidazole, benzoxazole, benzthiazole, 2-mercaptobenzimidazole, 2-mercaptobenzoxazole, 2-mercaptobenzthiazole, 3-morpholinomethyl-1-phenyl-triazole-2-thione, 5-amino-3-morpholinomethyl-thiazole-2-thione, 2-mercapto-5-methylthio-thiadiazole, triazole, tetrazole, benzotriazole, carboxybenzotriazole, amino group-containing benzotriazole, silane coupling agents, and the like.

(Antioxidant)

Once oxidized, most polymer materials undergo oxidative deterioration in turn to cause a reduction in function of the polymer components. Thus, an anti-oxidant such as (1) a radical supplement to scavenge generated radicals and/or (2) a peroxide decomposer which decomposes generated peroxides into a non-toxic substance to prevent further generation of radicals may be added to the thermosetting resin composition according to an embodiment of the present invention to prevent oxidation.

Specific compounds as such anti-oxidants which function as radical supplements include phenol-based compounds such as hydroquinone, 4-tert-butylcatechol, 2-t-butylhydroquinone, hydroquinone monomethyl ether, 2,6-di-t-butyl-p-cresol, 2,2-methylene-bis-(4-methyl-6-t-butylphenol), 1,1,3-tris(2-methyl-4-hydroxy-5-t-butylphenyl)butane, 1,3,5-trimethyl-2,4,6-tris(3,5-di-t-butyl-4-hydroxybenzyl) benzene, and 1,3,5-tris(3',5'-di-t-butyl-4-hydroxybenzyl)-S-triazine-2,4,6-(1H, 3H, 5H)trione; quinone-based compounds such as methaquinone and benzoquinone; amine-based compounds such as bis(2,2,6,6-tetramethyl-4-piperidyl)-sebacate and phenothiazine; and the like.

The radical supplement may also be a commercially available product and examples thereof include ADK STAB AO-30, ADK STAB AO-330, ADK STAB AO-20, ADK STAB LA-77, ADK STAB LA-57, ADK STAB LA-67, ADK STAB LA-68, and ADK STAB LA-87 (all manufactured by ADEKA Corporation; trade names); IRGANOX1010, IRGANOX1035, IRGANOX1076, IRGANOX1135, TINUVIN 111FDL, TINUVIN 123, TINUVIN 144, TINUVIN 152, TINUVIN 292, and TINUVIN 5100 (all manufactured by BASF Japan Ltd.; trade names); and the like. Specific compounds as such anti-oxidants which function as peroxide decomposers include phosphorus-based compounds such as triphenyl phosphite; sulfur-based compounds such as pentaerythritol tetralauryl thiopropionate, dilauryl thiodipropionate, and distearyl 3,3'-thiodipropionate; and the like.

The peroxide decomposer may also be a commercially available product and examples thereof include ADK STAB TPP (manufactured by ADEKA Corporation; trade name), MARK AO-412S (manufactured by ADEKA Corporation; trade name), SUMILIZER TPS (manufactured by Sumitomo Chemical Company, Limited; trade name), and the like.

One of the above-described anti-oxidants may be used alone or two or more thereof may be used in combination.

(UV Absorber)

In addition to the above-described anti-oxidants, an UV absorber may be used in the thermosetting resin composition according to an embodiment of the present invention to take measures for stabilization against UV light since the polymer materials absorb light to cause decomposition/deterioration.

Such UV absorbers include benzophenone derivatives, benzoate derivatives, benzotriazole derivatives, triazine derivatives, benzothiazole derivatives, cinnamate derivatives, anthranilate derivatives, dibenzoylmethane derivatives, and the like. Specific examples of the benzophenone derivatives include 2-hydroxy-4-methoxy-benzophenone, 2-hydroxy-4-methoxybenzophenone, 2-hydroxy-4-n-octoxybenzophenone, 2,2'-dihydroxy-4-methoxybenzophenone, 2,4-dihydroxybenzophenone, and the like; specific examples of the benzoate derivatives include 2-ethylhexysalicylate, phenylsalicylate, p-t-butylphenylsalicylate, 2,4-di-t-butylphenyl-3,5-di-t-butyl-4-hydroxybenzoate, hexadecyl-3,5-di-t-butyl-4-hydroxybenzoate, and the like; specific example of the benzotriazole derivatives include 2-(2'-hydroxy-5'-t-butylphenyl)benzotriazole, 2-(2'-hydroxy-5'-methylphenyl) benzotriazole, 2-(2'-hydroxy-3'-t-butyl-5'-methylphenyl)-5-chlorobenzotriazole, 2-(2'-hydroxy-3',5'-di-t-butylphenyl)-5-chlorobenzotriazole, 2-(2'-hydroxy-5'-methylphenyl) benzotriazole, and 2-(2'-hydroxy-3',5'-di-t-amylphenyl) benzotriazole; and specific examples of the triazine derivatives include hydroxyphenyltriazine, bisethylhexyloxyphenol methoxyphenyltriazine, and the like.

The UV absorber may also be a commercially available product and examples thereof include TINUVIN PS, TINUVIN 99-2, TINUVIN 109, TINUVIN 384-2, TINUVIN 900, TINUVIN 928, TINUVIN 1130, TINUVIN 400, TINUVIN 405, TINUVIN 460, and TINUVIN 479 (all manufactured by BASF Japan Ltd.; trade names); and the like.

One of the above-described UV absorbers may be used alone or two or more thereof may be used in combination. Use thereof in combination of the above-described anti-oxidants allows stabilization of a molded product obtained from the thermosetting resin composition according to an embodiment of the present invention.

(Other Additives)

The thermosetting resin composition according to an embodiment of the present invention may be further mixed with, as needed, an additive known in the art such as a thermal polymerization inhibitor known in the art such as hydroquinone, hydroquinone monomethyl ether, t-butylcatechol, pyrogallol, or phenothiazine; a thickener known in the art such as pulverizing silica, hydrotalcite, organic bentonite, or montmorillonite; an antifoaming and/or leveling agent such as a silicone-based, fluorine-based, or a polymer-based agent; a silane coupling agent such as an imidazole-based, thiazole-based, or triazole-based agent; or a rust-preventive agent.

(Organic Solvent)

To synthesize the above-described epoxy resin (A), to prepare a composition, or to control viscosity for coating on a board or a carrier film, an organic solvent may be further used in the thermosetting resin composition according to an embodiment of the present invention.

Such organic solvents may include ketones, aromatic hydrocarbons, glycol ethers, glycol ether acetates, esters, alcohols, aliphatic hydrocarbons, petroleum-based solvents, and the like. More specific examples include ketones such as methyl ethyl ketone and cyclohexanone; aromatic hydrocarbons such as toluene, xylene, and tetramethylbenzene; glycol ethers, such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether, and triethylene glycol monoethyl ether; esters such as ethyl acetate, butyl acetate, dipropylene glycol methyl ether acetate, propylene glycol methyl ether acetate, propylene glycol ethyl ether acetate, and propylene glycol butyl ether acetate; alcohols such as ethanol, propanol, ethylene glycol, and propylene glycol; aliphatic hydrocarbons such as octane and decane; petroleum-based solvents such as petroleum ether, petroleum naphtha, hydrogenated petroleum naphtha, and solvent naphtha; and the like. One of such organic solvents may be used alone or two or more thereof may be used as a mixture.

The thermosetting resin composition according to an embodiment of the present invention may also be made into the form of a dry film containing a carrier film (support) and a layer formed on the carrier film and containing the above-described thermosetting resin composition. Furthermore, it may be made into prepreg sheets semi-cured by being coated on and/or impregnated in sheet-like fibrous substrates such as glass cloths and glass and aramid nonwoven fabrics. When a dry film is made, the thermosetting resin composition according to an embodiment of the present invention diluted with the organic solvent and controlled to suitable viscosity can be coated to have a uniform thickness on a carrier film with a comma coater, a blade coater, a lip coater, a rod coater, a squeeze coater, a reverse coater, a transfer roll coater, a gravure coater, a spray coater, or the like and usually dried at a temperature of 50 to 130° C. for 1 to 30 minutes to obtain the film. The thickness of the coated film is not particularly limited but is generally appropriately selected from the range of 10 to 150 μm, preferably 10 to 60 μm, in terms of a film thickness after drying.

As the carrier film, a plastic film is used. Such plastic films including polyester films such as polyethylene terephthalate, polyimide films, polyamideimide films, polypropylene films, and polystyrene films are preferably used. The thickness of the carrier film is not particularly limited but is generally appropriately selected from the range of 10 to 150 μm.

The thermosetting resin composition according to an embodiment of the present invention is preferably coated and dried on the carrier film to form a thermosetting resin composition layer, followed by further laminating a releasable cover film on the surface of the thermosetting resin composition layer for the purpose of preventing dust from adhering to the surface of the thermosetting resin composition layer; and/or the like.

As the releasable cover film, for example, a polyethylene film, a polytetrafluoroethylene film, a polypropylene film, surface-treated paper, or the like may be used. When the cover film is released, adhesive strength between the thermosetting resin composition layer and the cover film is preferably lower than adhesive strength between the thermosetting resin composition layer and the carrier film.

A tack-free coating film can be formed by, for example, controlling with the organic solvent to viscosity suitable for a coating method, coating the thermosetting resin composition according to an embodiment of the present invention on a substrate by a method such as a dip coat method, a flow coat method, a roll coat method, a bar coater method, a screen printing method, or a curtain coat method, and volatilizing and drying (pre-drying) the organic solvent contained in the composition at a temperature of about 60 to 130° C. Further, in the case of a dry film wound up as a film by coating the above-described composition on the carrier film and drying it, a resin insulating layer can be formed by laminating the dry film onto the substrate by a laminator or the like so that the thermosetting resin composition layer is brought into contact with the substrate, and thereafter removing the carrier film.

Such substrates as described above may include a printed wiring board or a flexible printed wiring board on which a circuit is preformed, as well as copper-clad laminates of all grades (FR-4 and the like) employing materials such as copper-clad laminates for high frequency circuit in which paper phenol, paper epoxy, glass fabric epoxy, glass polyimide, glass fabric/nonwoven fabric epoxy, glass fabric/paper epoxy, synthetic fiber epoxy, and fluorine/polyethylene/PPO/cyanate esters are used; also polyimide films, PET films, glass substrates, ceramic substrates, wafer plates, and the like.

The volatilization and drying performed after coating the thermosetting resin composition according to an embodiment of the present invention can be performed by using a circulating type hot-air drying oven, an IR oven, a hot plate, a convection oven (a method for countercurrent contact with hot blast in a dryer using an apparatus equipped with a heat source of steam-based air heating system and a method of spraying hot blast on a support from a nozzle), or the like.

For example, by heating and thermally curing the thermosetting resin composition according to an embodiment of the present invention to a temperature of about 140 to 180° C., the epoxy group in the epoxy resin (A) can be reacted with the curing agent for an epoxy resin (B) to form a cured coating excellent in various characteristics such as heat resistance, chemical resistance, moisture sorption resistance, adhesiveness, and electrical characteristics.

The photo-curable resin composition according to an embodiment of the present invention is preferred as a permanent film for a printed wiring board and especially preferred as a solder resist or an interlayer insulation material.

EXAMPLES

<Preparation of Thermosetting Resin Composition>
According to mix proportions described in Table 1 to Table 3 below, materials described in Examples/Comparative Examples were each mixed, premixed by a stirring machine, and thereafter kneaded in a three-roll mill to prepare thermosetting resin compositions. Unless otherwise specified, the values in Tables are based on part(s) by mass.

<Production of Board>
Such a thermosetting resin composition (varnish) prepared as described above was liquid-coated and made into DF (dry film) to produce a board. The former was liquid-coated on a circuit board by a roll coater (Furnace Co., Ltd.). The latter was coated and dried on a PET film by an applicator to produce a thermosetting resin layer. Then, a cover film was laminated thereon to make DF. In both coating drying and DF, thermal curing was performed under specified conditions to form cured products.

A detailed production method for each of liquid coating and DF is described below.

(Liquid Coating)
A double-sided printed wiring board having a board thickness of 0.4 mm on which a circuit having a copper thickness of 15 µm was formed was prepared and subjected to pretreatment using CZ-8100 from Mec Company Ltd. Then, a thermosetting resin composition was coated on the printed wiring board subjected to the pretreatment using the roll coater (Furnace Co., Ltd.) while being controlled to 20 µm after drying. Then, thermal curing was performed in a circulating type hot-air drying oven at 170° C./60 min to form a cured product.

(Dry Film)
The thermosetting resin composition was coated as a carrier film on a PET film having a thickness of 38 µm using an applicator and dried at 90° C./10 min to form a thermosetting resin layer to have a film thickness of 20 µm. Furthermore, a cover film was laminated thereon to produce DF. Then, a double-sided printed wiring board having a board thickness of 0.4 mm on which a circuit having a copper thickness of 15 µm was formed was prepared, the board was subjected to pretreatment using CZ-8100 from Mec Company Ltd., and DF from which a cover film was removed was laminated on the board using a vacuum laminator. The lamination conditions were a temperature of 100° C. and a pressure of 5 kg/cm². Then, the PET film was removed, followed by performing thermal curing at 170° C./60 min to form a cured product.

TABLE 1

|  | Example 1 | Example 2 | Example 3 | Example 4 | Example 5 | Example 6 | Example 7 | Example 8 |
|---|---|---|---|---|---|---|---|---|
| Bisphenol A type epoxy resin*[1] | — | 55 | 55 | — | 55 | 55 | 55 | 55 |
| Naphthalene type epoxy resin*[2] | 100 | — | — | 100 | — | — | — | — |
| Phenol novolac type epoxy resin*[3] | — | 75 | 75 | — | 75 | 75 | 75 | 75 |
| Phenol novolac resin*[4] | 46.7 | 46.7 | 46.7 | 46.7 | 46.7 | 46.7 | 46.7 | 46.7 |
| Carboxylic acid-terminated polyimide resin*[5] | — | — | — | — | — | — | — | — |
| Active ester resin*[6] | — | — | — | — | — | — | — | — |
| Cyanate ester resin*[7] | — | — | — | — | — | — | — | — |
| MMA/nBA block copolymer*[8] | 66.7 | 133 | 110 | — | — | — | — | — |
| MMA/nBA block copolymer*[9] | — | — | — | 133 | 133 | 110 | 110 | 127 |
| MMA/nBA block copolymer*[10] | — | — | — | — | — | — | — | — |
| Polymethyl methacrylate*[11] | — | — | — | — | — | — | — | — |
| Poly-normal-butyl acrylate*[12] | — | — | — | — | — | — | — | — |
| Phenoxy resin*[13] | — | — | — | — | — | — | — | — |
| Spherical silica*[14] | 220 | 250 | 160 | 250 | 125 | — | — | — |
| Spherical alumina*[15] | — | — | — | — | — | 165 | 165 | 210 |
| Spherical alumina*[16] | — | — | — | — | 125 | — | — | — |
| Molten amorphous silica*[17] | — | — | — | — | — | — | — | — |
| Blue pigment*[18] | — | — | — | — | — | — | — | 2 |
| Yellow pigment*[19] | — | — | — | — | — | — | — | 2 |

TABLE 1-continued

|  | Example 1 | Example 2 | Example 3 | Example 4 | Example 5 | Example 6 | Example 7 | Example 8 |
|---|---|---|---|---|---|---|---|---|
| Imidazole[*20] | 1 | 1 | 1 | 1 | — | 1 | 1 | 1 |
| Cobalt acetylacetonato[*21] | — | — | — | — | — | — | — | — |
| Total | 434 | 561 | 448 | 531 | 560 | 453 | 453 | 518 |
| Total solid content | 369 | 419 | 289 | 419 | 419 | 365 | 365 | 381 |
| Filler content (wt %) | 60 | 60 | 50 | 60 | 60 | 50 | 50 | 55 |
| Block copolymer content (wt %) | 5 | 10 | 10 | 10 | 10 | 10 | 10 | 10 |

[*1]828, manufactured by Mitsubishi Chemical Corporation
[*2]HP-4032, manufactured by DIC Corporation
[*3]N-665 H60, manufactured by DIC Corporation, dissolved in cyclohexanone. Solid content 60%
[*4]HF-1M H60, manufactured by Meiwa Plastic Industries, Ltd., dissolved in cyclohexanone. Solid content 60%
[*5]V-8000, manufactured by DIC Corporation
[*6]EXB-9460-65T, manufactured by DIC Corporation
[*7]PT30, manufactured by Lonza Group Ltd.
[*8]MMA/nBA/MMA block copolymer, manufactured by Arkema K.K. Hydrophilic treatment. (MAM M52N H30) dissolved in cyclohexanone. Solid content 30%
[*9]MMA/nBA/MMA block copolymer, manufactured by Arkema K.K. (MAM M52 H30) dissolved in cyclohexanone. Solid content 30%
[*10]MMA/nBA/MMA block copolymer, manufactured by Arkema K.K. (MAM M53 H30) dissolved in cyclohexanone. Solid content 30%
[*11]BR-87 H30, manufactured by Mitsubishi Rayon Co., Ltd., Mw 25000, Solid content 30%
[*12]AS-3000E H30, manufactured by Negami Chemical Industrial Co., Ltd., Mw 65000, Solid content 30%
[*13]YX6954 BH30, manufactured by Mitsubishi Chemical Corporation, Solid content 30%
[*14]SO-C2, manufactured by Admatechs Company Limited, D50 = 0.5 μm
[*15]AO-502, manufactured by Admatechs Company Limited, D50 = 0.6 μm
[*16]TC-975C, manufactured by Admatechs Company Limited, D50 = 4 μm
[*17]FUSELEX WX, manufactured by Tatsumori Ltd., D50 = 1.5 μm
[*18]Phthalocyanine blue
[*19]Chromophthal yellow
[*20]1B2PZ, manufactured by Shikoku Chemicals Corporation
[*21]1% solution of cobalt acetylacetonato in DMF

TABLE 2

|  | Example 9 | Example 10 | Example 11 | Example 12 | Example 13 |
|---|---|---|---|---|---|
| Bisphenol A type epoxy resin[*1] | 55 | 55 | 20 | 60 | — |
| Naphthalene type epoxy resin[*2] | — | — | 80 | 40 | 100 |
| Phenol novolac type epoxy resin[*3] | 75 | 75 | — | — | — |
| Phenol novolac resin[*4] | 46.7 | 46.7 | — | — | — |
| Carboxylic acid-terminated polyimide resin[*5] | — | — | — | 222 | — |
| Active ester resin[*6] | — | — | 103 | — | — |
| Cyanate ester resin[*7] | — | — | — | — | 100 |
| MMA/nBA block copolymer[*8] | — | — | — | — | — |
| MMA/nBA block copolymer[*9] | 100 | — | 145 | 173 | 173 |
| MMA/nBA block copolymer[*10] | — | 120 | — | — | — |
| Polymethyl methacrylate[*11] | — | — | — | — | — |
| Poly-normal-butyl acrylate[*12] | — | — | — | — | — |
| Phenoxy resin[*13] | — | — | — | — | — |
| Spherical silica[*14] | — | — | 208 | 250 | 260 |
| Spherical alumina[*15] | 133 | — | — | — | — |
| Spherical alumina[*16] | — | 200 | — | — | — |
| Molten amorphous silica[*17] | — | — | — | — | — |
| Blue pigment[*18] | — | — | — | — | — |
| Yellow pigment[*19] | — | — | — | — | — |
| Imidazole[*20] | 1 | 1 | 1.7 | 2 | — |
| Cobalt acetylacetonato[*21] | — | — | — | — | 10 |
| Total | 411 | 498 | 557 | 747 | 643 |
| Total solid content | 294 | 365 | 420 | 504 | 522 |
| Filler content (wt %) | 45 | 55 | 50 | 50 | 50 |
| Block copolymer content (wt %) | 10 | 10 | 10 | 10 | 10 |

TABLE 3

|  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Bisphenol A type epoxy resin[*1] | — | — | — | — | — | — | — |
| Naphthalene type epoxy resin[*2] | 100 | 100 | 100 | 100 | 100 | 100 | 100 |
| Phenol novolac type epoxy resin[*3] | — | — | — | — | — | — | — |
| Phenol novolac resin[*4] | 46.7 | 46.7 | 46.7 | 46.7 | 46.7 | 46.7 | 46.7 |
| Carboxylic acid-terminated polyimide resin[*5] | — | — | — | — | — | — | — |
| Active ester resin[*6] | — | — | — | — | — | — | — |
| Cyanate ester resin[*7] | — | — | — | — | — | — | — |

TABLE 3-continued

|  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| MMA/nBA block copolymer*8 | — | — | — | 66.7 | — | — | — |
| MMA/nBA block copolymer*9 | — | — | — | — | — | — | — |
| MMA/nBA block copolymer*10 | — | — | — | — | — | — | — |
| Polymethyl methacrylate*11 | — | — | — | — | 88.6 | — | — |
| Poly-normal-butyl acrylate*12 | — | — | — | — | 44.3 | — | — |
| Phenoxy resin*13 | — | — | — | — | — | 133 | 133 |
| Spherical silica*14 | 190 | 85 | — | — | — | 250 | 250 |
| Spherical alumina*15 | — | — | — | — | — | — | — |
| Spherical alumina*16 | — | — | — | — | — | — | — |
| Molten amorphous silica*17 | — | — | 190 | 220 | 250 | — | — |
| Blue pigment*18 | — | — | — | — | — | — | — |
| Yellow pigment*19 | — | — | — | — | — | — | — |
| Imidazole*20 | 1 | 1 | 1 | 1 | 1 | 1 | 1 |
| Cobalt acetylacetonato*21 | — | — | — | — | — | — | — |
| Total | 338 | 233 | 338 | 434 | 531 | 531 | 531 |
| Total solid content | 319 | 214 | 319 | 369 | 419 | 419 | 419 |
| Filler content (wt %) | 60 | 40 | 60 | 60 | 60 | 60 | 60 |
| Block copolymer content (wt %) | — | — | — | 5 | — | — | — |

<Testing Method>
(B-Stage State)

The thermosetting resin composition was coated as a carrier film on a PET film having a thickness of 38 μm using the applicator to have a film thickness of 20 μm after drying at 90° C./10 min, so that DF in a B-stage state (semi-curing state) was produced. Then, DF on which the obtained thermosetting resin composition was formed was subjected to slit processing into a specified size and the state of DF was confirmed.
Good: After slit processing, neither dry film cracking nor powdery coming-off of a resin was confirmed.
Fair: After slit processing, slight dry film cracking was confirmed.
Poor: After slit processing, dry film cracking or powdery coming-off of a resin was confirmed.
(Liquid Coating Handling Crack)

A double-sided printed wiring board having a board thickness of 0.4 mm and a size of 500 mm×410 mm on which a circuit having a copper thickness of 15 μm was formed was prepared and subjected to pretreatment using CZ-8100 from Mec Company Ltd. Then, a thermosetting resin composition was coated on the printed wiring board subjected to the above-described pretreatment using the roll coater (Furnace Co., Ltd.) while being controlled to have a film thickness of 20 μm after drying 90° C./10 min. Because of simultaneous coating on both sides, suspension drying was performed and dry film cracking was evaluated by visual observation according to the following criteria during takeout/transportation after the drying.
Good: After drying, no coating film cracking was confirmed.
Fair: After drying, slight coating film cracking was confirmed.
Poor: After drying, coating film cracking was confirmed.
(Warpage of Board after Curing)

Each thermosetting resin composition was single-side coated (thickness of about 20 μm after curing) on the gloss surface of copper foil of 18 μm by the applicator. Then, it was cured at 170° C./60 min in a circulating type hot-air drying oven and the state of warpage was evaluated by visual observation according to the following criteria. Also, the appearance examples of boards corresponding to each evaluation are represented in FIG. 1. The appearance examples of the boards corresponding to the following "poor" (two examples), the appearance examples of the boards corresponding to "fair" (two examples), and the corresponding examples of the boards corresponding to "good" (two examples) are represented from the left of FIG. 1 in this order.
Good: Level of warpage was low.
Fair: Warpage was seen.
Poor: Cured product was shrunk cylindrically.
(Laser Processability)

Each of the thermosetting resin compositions described in Examples/Comparative Examples was formed on a copper clad laminate having a copper thickness of 15 μm to have a thickness of about 20 μm after curing. The compositions described for liquid were coated on PET films by a roll coater according to the procedure, the compositions described for DF were also similarly coated on PET films according to the above-described procedure to produce DF, followed by being laminated on circuit boards and performing curing reaction in the same manner as described above to produce each board. In the boards, laser processability was evaluated. The processability was compared by a CO2 laser (10.6 μm) as a light source. To judge which of the processability is better, all laser processing was performed under the same conditions. The processability was evaluated according to the following criteria:
CO2 laser (Hitachi Via Mechanics, Ltd.)
Target processing diameters were a top diameter of 65 μm and a bottom diameter of 50 μm.
Condition: Aperture (mask diameter): 3.1 mm/Pulse width 20 μsec/Output
2W/Frequency 5 kHz/Number of shots: burst 3 shots
Good: State in which a difference from a target processing diameter was <±2 μm and a processed hole wall was smooth.
Fair: State in which a difference from a target processing diameter was <±2 μm but recesses and salients were seen in a processed hole wall.
Poor: A difference from a target processing diameter was ≥±2 μm.
(Desmear Resistance)

Each of the thermosetting resin compositions described in Examples/Comparative Examples was formed on a copper clad laminate having a copper thickness of 15 μm and a board thickness of 0.4 mm to have a thickness of about 20 μm after curing. Curing reaction was performed in the same manner as described above. For the boards, desmear resistance was evaluated with an aqueous permanganic acid desmear solution (wet method) according to the following desmear treatment conditions and evaluation criteria:

Desmear treatment conditions (Rohm and Haas Company)

| Swelling | MLB-211 | Temperature 80° C./Time 10 min |
| Permanganic acid | MLB-213 | Temperature 80° C./Time 15 min |
| Reduction | MLB-216 | Temperature 50° C./Time 5 min |

Evaluation Criteria
Good: Surface roughness Ra was <0.15 μm.
Good-Fair: Surface roughness Ra was 0.15 to 0.3 μm.
Fair: Surface roughness Ra is >0.3 μm and <0.5 μm.
Poor: Surface roughness Ra is >0.5 μm.

(Thermal Cycle Characteristics)

Laser processing was performed under the above-described conditions, boards in which laser vias having a top diameter of 65 μm and a bottom diameter of 50 μm were formed were subjected to desmear treatment in the same manner as described above, and the bottoms of the laser vias were desmeared. Then, plating was performed using an electroless nickel plating bath and an electroless gold plating bath which were commercially available products under conditions of nickel of 0.5 μm and gold-plating of 0.03 μm to perform gold-plating treatment of the laser via bottoms.

For each board obtained in such a manner, thermal cycle characteristics were evaluated. A heat history was added at each cycle of −65° C. for 30 min and 150° C. for 30 min as treatment conditions and the situations of the surfaces of the thermosetting resin compositions and the peripheral areas of the laser vias were observed with an optical microscope after a lapse of 2000 cycles. The number of observed holes was 100.

Excellent: The number of generated cracks was <10%.
Good: The number of generated cracks was 10 to 20%.
Fair: The hole number of generated cracks was >20% and <30%.
Poor: The hole number of generated cracks was >30%.

The results obtained by the above-mentioned tests are listed in Table 4 and Table 5 below.

TABLE 4

| | Example 1 | Example 2 | Example 3 | Example 4 | Example 5 | Example 6 | Example 7 | Example 8 | Example 9 | Example 10 |
|---|---|---|---|---|---|---|---|---|---|---|
| Liquid coating or DF | DF | DF | Liquid | DF | DF | DF | Liquid | DF | DF | DF |
| Made into DF; State of B-stage | Good | Good | — | Good | Good | Good | — | Good | Good | Good |
| Liquid coating; Handling crack | — | — | Good | — | — | — | Good | — | — | — |
| Warpage of board after curing | Good | Good | Good | Good | Good | Good | Good | Good | Good | Good |
| Laser processability | Good | Good | Good | Good | Good | Good | Good | Good | Good | Good |
| Desmear resistance | Good | Good-Fair | Good-Fair | Good | Good | Good | Good | Good | Good | Good |
| Thermal cycle characteristics | Good | Good | Good | Excellent | Excellent | Excellent | Excellent | Excellent | Good | Excellent |

TABLE 5

| | Example 11 | Example 12 | Example 13 | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|---|---|
| Liquid coating or DF | DF | DF | DF | DF | DF | Liquid | Liquid | DF | DF | Liquid |
| Made into DF; State of B-stage | Good | Good | Good | Poor | Fair | — | — | Fair | Fair | — |
| Liquid coating; Handling crack | — | — | — | — | — | Poor | Good | — | — | Fair |
| Warpage of board after curing | Fair | Fair | Fair | Poor | Poor | Poor | Good | Poor | Poor | Poor |
| Laser processability | Good | Good | Good | Good | Good | Fair | Fair | Fair | Good | Good |
| Desmear resistance | Good | Good | Good | Good | Good | Good | Good | Fair | Fair | Fair |
| Thermal cycle characteristics | Good | Good | Good | Fair | Poor | Poor | Fair | Poor | Fair | Fair |

As is clear from the results of Table 5 described above, in the case of using the thermosetting resin compositions in Comparative Examples 1 to 3 and 5 to 7, which were not mixed with any block copolymer, the film cracking or the powdery coming-off was confirmed when the slit processing was performed in the DF-making test and the film cracking was similarly confirmed during the takeout/transportation after the drying in the liquid test coating. Further, the board warpage after the curing occurred. Further, it can be confirmed from the comparison between Comparative Examples 1 and 3 that the thermal cycle characteristics were deteriorated by using the molten amorphous silica rather than the spherical silica. Further, Comparative Example 4 exhibited that the thermal cycle characteristics were deteriorated as well as the recesses and salients were generated on the processed wall surface after the laser processing when the molten amorphous silica rather than the spherical silica was used even if a block copolymer was used.

In contrast, as is clear from the results of Table 4 and Table 5 described above, when the thermosetting resin compositions according to embodiments of the present invention in Examples 1 to 13 were used, the occurrence of deficiencies such as generation of cracks was suppressed in both cases of made into DF and liquid coating, the boards were slightly warped after the curing, and the laser processability, the desmear resistance, and the thermal cycle characteristics were also good.

The invention claimed is:

1. A thermosetting resin composition, comprising:
   an epoxy resin;
   a curing agent for the epoxy resin;
   spherical silicon dioxide and/or spherical aluminum oxide; and
   a block copolymer,
   wherein the block copolymer has a weight average molecular weight, Mw, of 50000 or more and 300000 or less and a molecular weight distribution, Mw/Mn, of 3 or less, and the spherical silicon dioxide and/or spherical aluminum oxide are included in an amount of 50 wt % or more based on a total thermosetting resin composition.

2. The thermosetting resin composition according to claim 1, wherein the molecular weight distribution of the block copolymer is 2.5 or less.

3. The thermosetting resin composition according to claim 1, wherein the block copolymer is a block copolymer represented by formula (I):

X—Y—X  (I)

where X is a polymer unit having a glass transition point Tg of 0° C. or more; and
   Y is a polymer unit having a glass transition point Tg of less than 0° C.

4. The thermosetting resin composition according to claim 3, wherein in the formula (I),
   Y comprises poly-n-butyl(meth)acrylate; and
   X comprises polymethyl(meth)acrylate.

5. The thermosetting resin composition according to claim 1, wherein the curing agent is a phenolic resin.

6. A thermosetting film obtained by a process comprising applying and drying, onto a film, the thermosetting resin composition according to claim 1.

7. A cured product prepared by a process comprising heating and curing the thermosetting resin composition according to claim 1 or a thermosetting film obtained by a process comprising applying and drying, onto a film, the thermosetting resin composition.

8. The thermosetting resin composition according to claim 1, wherein the molecular weight distribution of the block copolymer is 2.0 or less.

9. The thermosetting resin composition according to claim 1, wherein the epoxy resin is included in an amount of 20 to 80 mass % based on a total solid of the thermosetting resin composition.

10. The thermosetting resin composition according to claim 1, wherein the epoxy resin is included in an amount of 20 to 60 mass % based on a total solid of the thermosetting resin composition.

11. The thermosetting resin composition according to claim 10, wherein the curing agent is included in an amount of 0.3 to 1.5 mol based on one mol of the epoxy resin.

12. The thermosetting resin composition according to claim 11, wherein the spherical silicon dioxide and spherical aluminum oxide are included in an amount of 50 wt % or more based on a total thermosetting resin composition.

13. The thermosetting resin composition according to claim 11, wherein the block copolymer is included in an amount of 5 to 35 parts by mass in a solid content based on 100 parts by mass of the epoxy resin.

14. The thermosetting resin composition according to claim 13, wherein in the formula (I), Y comprises poly-n-butyl(meth)acrylate, and X comprises polymethyl(meth)acrylate.

15. The thermosetting resin composition according to claim 14, wherein the curing agent is a phenolic resin.

16. The thermosetting resin composition according to claim 15, wherein the spherical silicon dioxide and the spherical aluminum oxide are present.

17. A printed wiring board, comprising:
   a cured product prepared by heating and curing a thermosetting resin composition applied to a printed wiring board, or a film obtained by coating and drying a thermosetting resin composition onto a carrier film, applying the film to a printed wiring board, and heating and curing the film,
   wherein thermosetting resin composition comprises
   an epoxy resin,
   a curing agent for the epoxy resin,
   spherical silicon dioxide and/or spherical aluminum oxide, and
   a block copolymer having a weight average molecular weight, Mw, of 50000 or more and 300000 or less and a molecular weight distribution, Mw/Mn, of 3 or less.